US009402320B2

(12) United States Patent
Hoffmeyer et al.

(10) Patent No.: US 9,402,320 B2

(45) Date of Patent: Jul. 26, 2016

(54) ELECTRONIC COMPONENT ASSEMBLY

(71) Applicant: International Business Machines Corporation, Armonk, NY (US)

(72) Inventors: Mark K. Hoffmeyer, Rochester, MN (US); Theron L. Lewis, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 264 days.

(21) Appl. No.: 13/677,769

(22) Filed: Nov. 15, 2012

(65) Prior Publication Data

US 2014/0133122 A1 May 15, 2014

(51) Int. Cl.

*H05K 5/02* (2006.01)
*H05K 3/32* (2006.01)
*H01R 43/16* (2006.01)

(Continued)

(52) U.S. Cl.

CPC .................. *H05K 3/32* (2013.01); *H01R 43/16* (2013.01); *H01R 43/205* (2013.01); *H05K 3/306* (2013.01); *H05K 3/308* (2013.01); *H01R 12/52* (2013.01); *H01R 12/523* (2013.01); *H01R 12/585* (2013.01); *H01R 12/712* (2013.01); *H05K 3/301* (2013.01); *H05K 3/368* (2013.01); *H05K 2201/10189* (2013.01);

(Continued)

(58) Field of Classification Search

CPC ......... H05K 3/32; H05K 3/308; H05K 3/301; H05K 3/306; H05K 3/368; H05K 2201/10189; H05K 2201/10303; H05K 2201/10424; H05K 2201/10856; H05K 2201/10871; H01R 43/16; H01R 43/205; H01R 12/52; H01R 12/58; H01R 12/523; H01R 12/585; H01R 12/712

USPC ......... 174/255, 257, 261, 262, 266, 267, 260; 361/760, 767, 772, 784, 785; 439/75, 439/78, 79, 82, 84, 567, 751, 825, 65, 74, 439/83

See application file for complete search history.

(56) References Cited

U.S. PATENT DOCUMENTS 4,029,388 A * 6/1977 Knoll ............................ 439/736
4,186,982 A 2/1980 Cobaugh et al.

(Continued)

OTHER PUBLICATIONS

Anderson, "Aluminum Electrolytic Capacitor Holder for Ruggedized Automotive Applications", AVX Online. www.avx.com/docs/techinfo/AutoCapHolder.pdf.

(Continued)

*Primary Examiner* — Ishwarbhai B. Patel
*Assistant Examiner* — Paresh Paghadal
(74) *Attorney, Agent, or Firm* — Laura E. Gisler; Robert Williams

(57) ABSTRACT

According to embodiments of the invention, an electronic component assembly may be provided. The electronic component assembly may include an electronic component body. The electronic component assembly may also include a non-conductive force transfer plate affixed to the electronic component body to receive an assembly force. The electronic component assembly may also include a plurality of electrical connectors passing through the non-conductive force transfer plate, wherein first ends of the electrical connectors are located within the electronic component body and second ends are located outside the electronic component body, and the electrical connectors have a force transfer structure adapted to engage the non-conductive force transfer plate and transfer at least a portion of the assembly force from the force transfer plate to the electrical connectors.

6 Claims, 3 Drawing Sheets

(51) Int. Cl.

| | |
|---|---|
| ***H05K 3/30*** | (2006.01) |
| ***H01R 43/20*** | (2006.01) |
| *H01R 12/52* | (2011.01) |
| *H01R 12/71* | (2011.01) |
| *H05K 3/36* | (2006.01) |
| *H01R 12/58* | (2011.01) |

(52) U.S. Cl.

CPC ............... *H05K 2201/10303* (2013.01); *H05K 2201/10856* (2013.01); *Y10T 29/4913* (2015.01); *Y10T 29/49117* (2015.01)

(56) References Cited

U.S. PATENT DOCUMENTS 5,036,431 A * 7/1991 Adachi et al. ................. 361/803
5,564,954 A * 10/1996 Wurster ........................ 439/751
5,823,830 A 10/1998 Wurster
5,893,779 A 4/1999 Bianca et al.
5,916,000 A 6/1999 Feldmeier et al.
5,944,538 A 8/1999 Sorig
6,046,911 A * 4/2000 Dranchak et al. ............. 361/784
6,623,280 B2 * 9/2003 Oldenburg et al. ............. 439/75
6,870,727 B2 3/2005 Edson et al.
7,008,272 B2 3/2006 Blossfeld
7,074,094 B2 7/2006 Kawahara et al.
7,271,995 B2 9/2007 Edson et al.
7,336,098 B2 2/2008 Wang et al.
7,377,823 B2 5/2008 Chen
7,445,455 B2 * 11/2008 Yokozuka et al. .............. 439/55
7,445,499 B2 * 11/2008 Nunokawa et al. ........... 439/567
7,656,647 B2 2/2010 Edson et al.
7,896,662 B2 * 3/2011 Chen ............................... 439/83
8,075,640 B2 12/2011 Marek et al.
8,092,262 B1 1/2012 Frederick et al.
8,199,462 B2 6/2012 Zednicek et al.
8,624,122 B2 * 1/2014 Shiraiwa et al. .............. 174/252
2002/0124994 A1 * 9/2002 Tanaka et al. ................ 165/80.2
2003/0162434 A1 * 8/2003 Kamiya ........................ 439/381
2006/0246786 A1 * 11/2006 Noguchi ....................... 439/751
2008/0169768 A1 * 7/2008 Yang ............................ 315/276
2008/0207015 A1 * 8/2008 Sueyoshi ........................ 439/75
2009/0168381 A1 * 7/2009 Suehiro ......................... 361/772
2009/0242245 A1 * 10/2009 Asano ........................... 174/255
2009/0242262 A1 * 10/2009 Asano .................. H05K 3/0064
174/267

OTHER PUBLICATIONS

"Capacitor Holder (Solderless) The Interplex CAP-LOC System", Interplex Industries Inc, College Point, NY, © 2010. http://www.interplex.com/capacitor-holder.

* cited by examiner

ELECTRONIC COMPONENT ASSEMBLY

TECHNICAL FIELD

The field of the invention relates generally to electronic components, and more specifically, to securing electrical connectors to an electronic component body.

BACKGROUND

Computer systems typically include a combination of computer programs and hardware, such as semiconductors, transistors, chips, circuit boards, storage devices, and processors. The computer programs are stored in the storage devices and are executed by the processors. A common feature of many computer systems is the presence of one or more printed circuit boards. Printed circuit boards contain a variety of components mounted to a board.

SUMMARY

According to embodiments of the invention, an electronic component assembly may be provided. The electronic component assembly may include an electronic component body. The electronic component assembly may also include a non-conductive force transfer plate affixed to the electronic component body to receive an assembly force. The electronic component assembly may also include a plurality of electrical connectors passing through the non-conductive force transfer plate, wherein first ends of the electrical connectors are located within the electronic component body and second ends are located outside the electronic component body, and the electrical connectors have a force transfer structure adapted to engage the non-conductive force transfer plate and transfer at least a portion of the assembly force from the force transfer plate to only one or more of the electrical connectors.

According to other embodiments, a method may be provided for assembling an electronic component assembly. The method may include an operation of providing an electronic component body. The method may also include an operation of affixing a non-conductive force transfer plate to the electronic component body. The method may also include an operation of passing a plurality of electrical connectors through the non-conductive force transfer plate with first ends of the electrical connectors being located within the electronic component body and second ends terminating outside the electronic component body.

According to other embodiments, a method may be provided for assembling a printed circuit board assembly. The method may include the operations of assembling an electronic component assembly. The method may also include attaching the electronic component assembly to a printed circuit board by applying an assembly force to the non-conductive force transfer plate and having at least a portion of the assembly force transfer only to one or more of the electrical connectors.

BRIEF DESCRIPTION OF THE SEVERAL VIEWS OF THE DRAWINGS

In the drawings and the Detailed Description, like numbers generally refer to like components, parts, steps, and processes.

DETAILED DESCRIPTION

Modern day manufacturing methods for the production of printed circuit boards (PCBs) may include the process of electrically and mechanically connecting electronic components, such as transistors and capacitors, to the PCB. One method of providing these connections includes placing the electrical connectors of the electronic components on or in the PCB, and melting and flowing solder to fill any space between the electrical connectors and the PCB. Due to the heat required to melt and flow the solder, this method may be hazardous to electronic components since many are heat sensitive.

Another method of providing the connections includes creating an interference fit between the electrical connectors and the PCB. This may include forcing electrical connectors, such as compliant pins, into holes, or vias, of the PCB that are slightly smaller in diameter than the electrical connectors. However, this method may be difficult to implement due to the delicate nature of many electronic components. For example, if a particular PCB assembly process includes mounting a capacitor with compliant pins, a manufacturer may apply assembly forces to the top of the capacitor which may force the pins further into the body of the capacitor rather than force the compliant pins into the holes of the PCB, which may impair the functionality of the capacitor.

Embodiments of the invention provide an electronic component assembly for electrically and mechanically connecting electronic components to a PCB. The electronic component assembly may include an electronic component body, a non-conductive force transfer plate, and a plurality of electrical connectors. The non-conductive force transfer plate may mechanically capture both a portion of the electronic component body and a portion of the electrical connectors. For example, a non-conductive force transfer plate may be a plastic plate that is molded around a portion of the electronic component body and a portion of the electrical connectors. Embodiments of the invention utilize the non-conductive force transfer plate to transfer at least a portion of any assembly forces only to one or more of the electrical connectors, such as compliant pins, and thereby avoid applying any significant assembly or insertion forces to the electronic component body.

Figure 1:
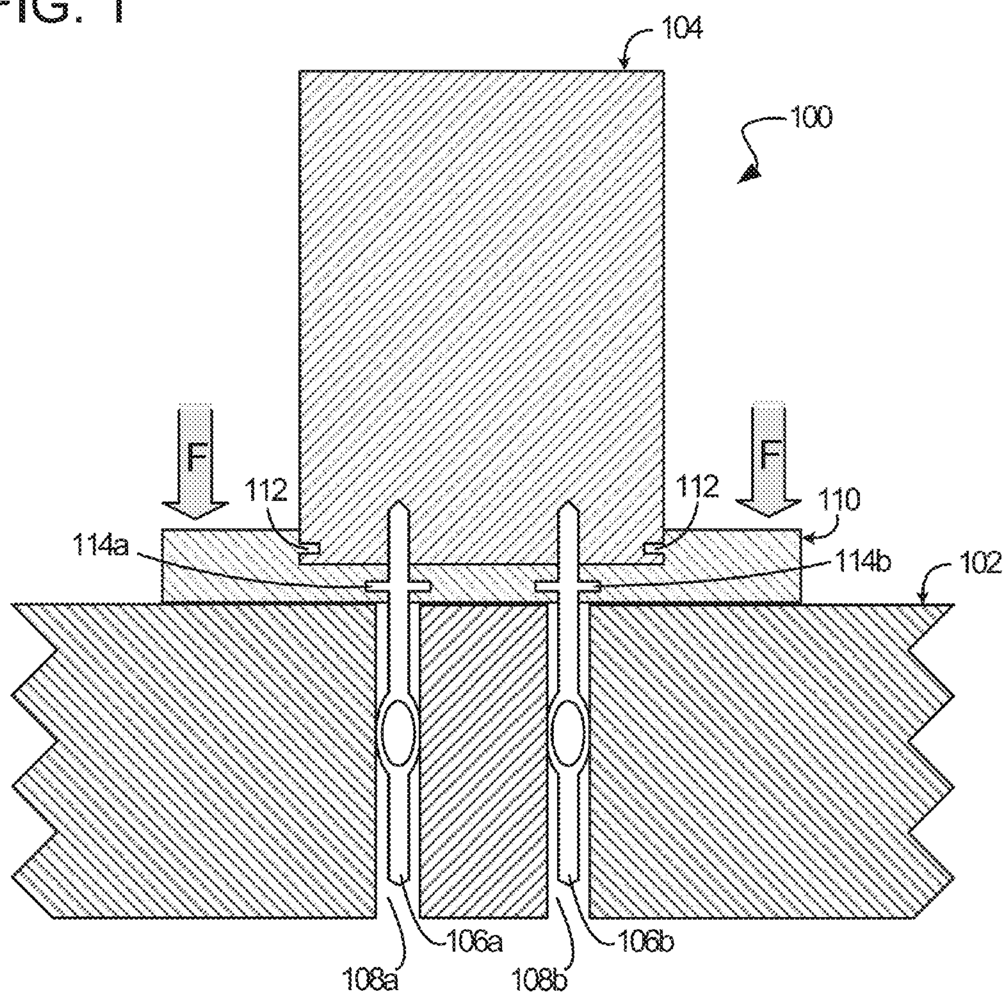
FIG. 1 is a side view of a cross section of an electronic component assembly, according to an embodiment of the invention.

Referring to the drawings, wherein like numbers denote like parts throughout the several views, FIG. 1 depicts the side view of a cross section of an electronic component assembly 100, according to an embodiment of the invention. The electronic component assembly 100 may be an element of a computer system such as a mainframe, server, or personal computer. The electronic component assembly 100 may include an electronic component body 104, electrical connectors 106*a* and 106*b*, generically referred to as electrical connectors 106, and a non-conductive force transfer plate 110. The electronic component body 104 may contain a capacitor, inductor, transistor, diode, any other electronic component, or a combination of two or more electronic components. In some embodiments, the combination of two or more electronic components may include two or more different types of the electronic components previously listed. The electrical connectors 106 may be compliant pins or any other similar electrical connectors. The electronic component assembly 100 may be mechanically attached and electrically connected to a PCB 102 to create a printed circuit board assembly, such as a motherboard. The electrical connectors 106 may be adapted to provide an electrical connection between the electronic component body 104 and the PCB 102 by way of an interference fit, or press fit, between the electrical connectors 106 and holes, or vias, 108*a* and 108*b*, generically referred to as holes 108, of the PCB 102 into which the electrical connectors 106 are placed. An example of a compliant pin which may provide an interference fit, or press fit, is an "eye-of-the-needle" compliant pin.

The non-conductive force transfer plate 110 may mechanically capture both a portion of the electronic component body 104 and a portion of the electrical connectors 106. The mechanical capture of the portion of the electronic component body 104 may include enclosing a feature of the electronic component body 104, such as a notch 112, within the non-conductive force transfer plate 110. The mechanical capture of a portion of the electrical connectors 106 may include enclosing a force transfer structure 114*a* and 114*b*, generically referred to as force transfer structure 114, of a surface of the electrical connectors of the electrical connectors 106 within the non-conductive force transfer plate 110. The force transfer structure 114 may include one or more spurs, knurled surfaces, flanges, or any other similar structure. The non-conductive force transfer plate 110 may be made of any non-conductive material that may facilitate the mechanical connection between the plate 110, the electronic component body 104 and the connectors 106, such as a plastic, ceramic, any circuit board material, or any other similar material. This mechanical capture may result in a electronic component assembly 100 that transfers at least portion of an assembly or insertion force F from the non-conductive force transfer plate 110 to only one or more the electrical connectors 106.

Figure 2:
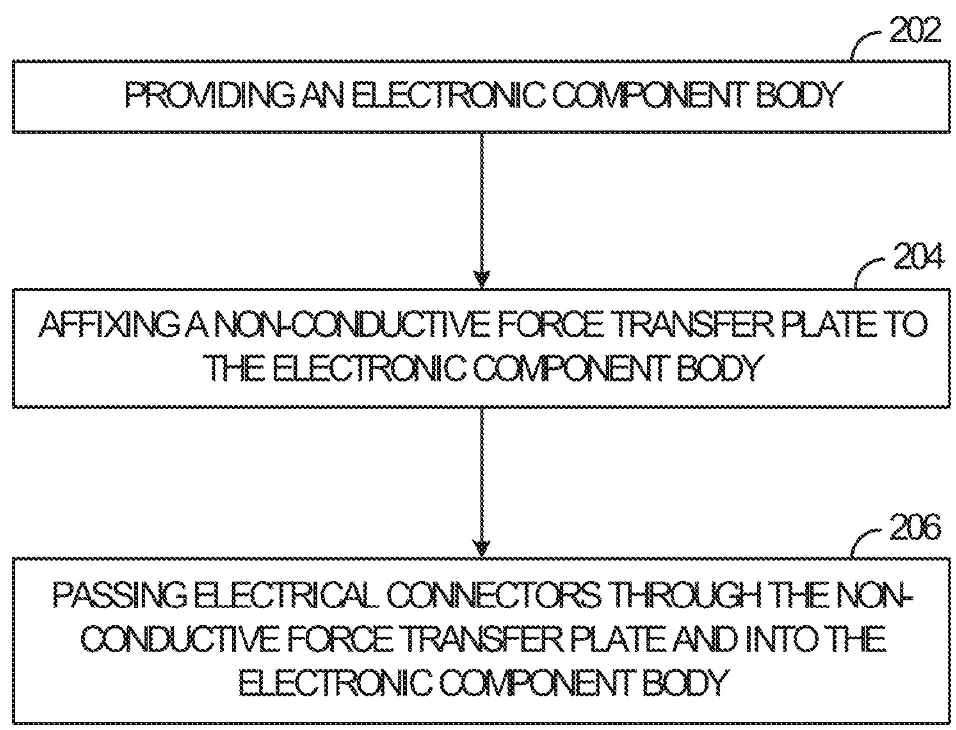
FIG. 2 is a flow chart of a method of assembling an electronic component assembly, according to an embodiment of the invention.

FIG. 2 is a flow chart of a method of assembling an electronic component assembly, according to an embodiment of the invention. Block 202 may contain the operation of providing an electronic component body. As previously explained, an electronic component body may contain a capacitor, inductor, transistor, diode, any other electronic component, or a combination of two or more electronic components. Block 204 may contain the operation of affixing a non-conductive force transfer plate to the electronic component body. As previously explained, the non-conductive force transfer plate may be a plastic plate, a ceramic plate, or a plate made of any other similar material. An example of a mode of affixing the electronic component body to the non-conductive force transfer plate may include molding the plate around a feature, such as a notch, of the electronic component body. Another example may include a mechanical locking mechanism within the non-conductive force transfer plate, such as a plurality of tabs, which engage the feature of the electronic component body after an assembly force is applied. Block 206 may contain the operation of passing a plurality of electrical connectors through the non-conductive force transfer plate. The electrical connectors may have an end that is within the electronic component body and an opposite end that is outside the electronic component body. The ends of the electrical connectors within the electronic component body may be electrically connected to the electronic component body. The electrical connectors may be affixed to the non-conductive force transfer plate in the same manner as the electronic component body.

Figure 3:
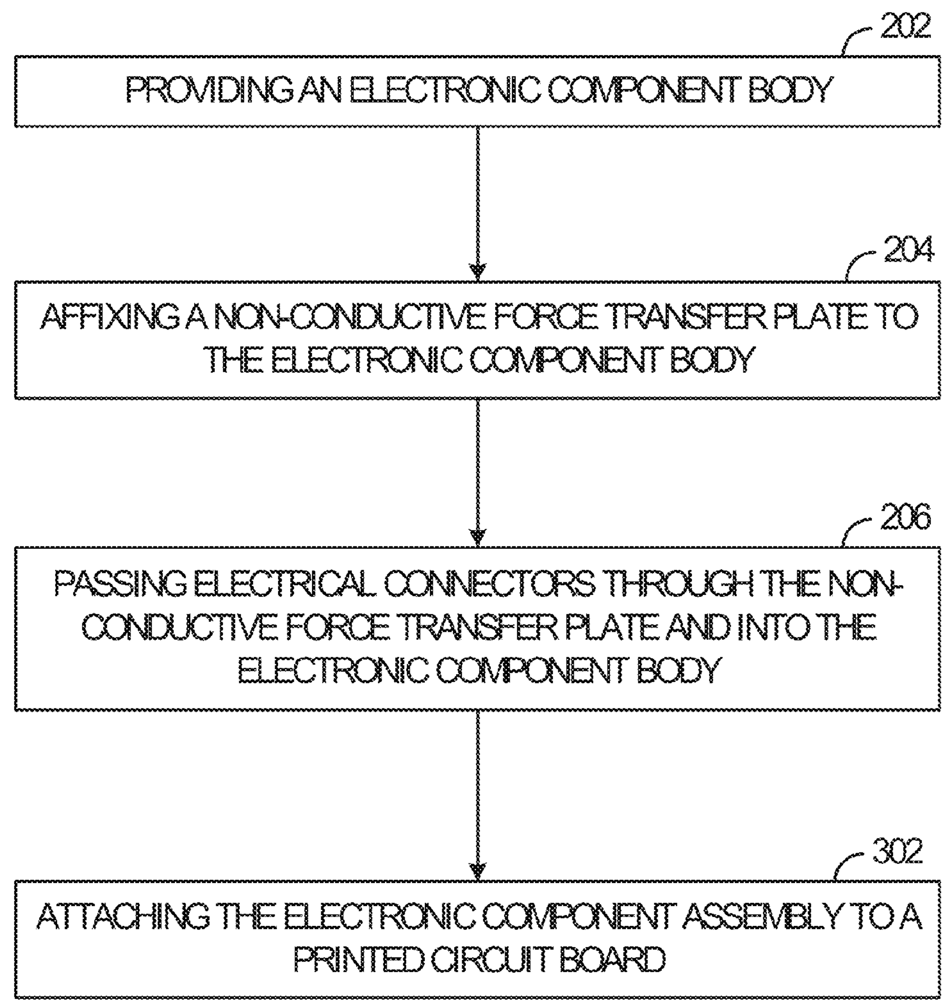
FIG. 3 is a flow chart of a method of assembling a printed circuit board assembly, according to an embodiment of the invention.

FIG. 3 is a flow chart of a method of assembling a printed circuit board assembly, according to an embodiment of the invention. Blocks 202, 204, and 206 may contain the operations of the correspondingly numbered blocks of FIG. 2, which may provide an electronic component assembly. Block 302 may contain the operation of attaching the electronic component assembly to a printed circuit board by applying an assembly force to the non-conductive force transfer plate. At least a portion of the assembly force may transfer only to one or more of the electrical connectors and thereby avoid applying any significant assembly or insertion forces to the electronic component body. This may result in the electrical connectors being forced into holes, or vias, in the PCB, and through an interference fit, or press fit, provide a mechanical attachment and electrical connection between the electronic component assembly and the PCB.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. An electronic component assembly, comprising:

an electronic component body;

a non-conductive force transfer plate having a surface extending beyond a footprint of the electronic component body, the surface oriented to directly receive an assembly force, the force transfer plate affixed to the electronic component body by an attaching structure, the attaching structure of the force transfer plate embedded in a groove along the side surface of the electronic component body and engaging the electronic component body in a plane aligned with a horizontal plane of the force transfer plate;

a plurality of compliant pins passing through the non-conductive force transfer plate, wherein first ends of the compliant pins are located within the electronic component body and second ends are located outside the electronic component body, and the compliant pins have a force transfer structure embedded in the non-conductive force transfer plate to mechanically engage the non-conductive force transfer plate and directly transfer the assembly force to the compliant pins and;

a printed circuit board mechanically and electrically connected to the electronic component assembly by the compliant pins.

2. The assembly of claim 1, wherein the electronic component body contains an electronic component selected from one of a capacitor, an inductor, a diode, and a transistor.

3. The assembly of claim 1, wherein the electronic component body contains two or more electronic components.

4. The assembly of claim 1, wherein the force transfer structure is one or more spurs.

5. The assembly of claim 1, wherein the force transfer structure is one or more flanges.

6. The assembly of claim 1, wherein the force transfer structure includes one or more knurled surfaces.

* * * * *